(12) United States Patent
Hahn et al.

(10) Patent No.: US 8,487,730 B2
(45) Date of Patent: Jul. 16, 2013

(54) MAGNETIC FIELD GENERATING DEVICE

(75) Inventors: Robert Hahn, Waldsassen (DE);
Andreas Ziegler, Weiden (DE)

(73) Assignee: Siemens Aktiengesellschaft, München (DE)

( * ) Notice: Subject to any disclaimer, the term of this patent is extended or adjusted under 35 U.S.C. 154(b) by 196 days.

(21) Appl. No.: 12/780,611

(22) Filed: May 14, 2010

(65) Prior Publication Data

US 2010/0295642 A1 Nov. 25, 2010

(30) Foreign Application Priority Data

May 20, 2009 (DE) .................... 10 2009 022 074

(51) Int. Cl.
*H01F 5/00* (2006.01)
*H01F 1/00* (2006.01)
*H01F 6/00* (2006.01)

(52) U.S. Cl.
USPC ........................ 335/300; 335/216; 335/296

(58) Field of Classification Search
USPC ........................................ 335/216, 296–300
See application file for complete search history.

(56) References Cited

U.S. PATENT DOCUMENTS

| | | | | |
|---|---|---|---|---|
| 3,074,401 A | * | 1/1963 | Friedman et al. | 422/46 |
| 4,578,962 A | * | 4/1986 | Dustmann | 62/505 |
| 5,461,873 A | * | 10/1995 | Longsworth | 62/51.1 |
| 6,622,494 B1 | * | 9/2003 | Pourrahimi | 62/51.1 |
| 7,234,319 B2 | * | 6/2007 | Sone | 62/434 |

FOREIGN PATENT DOCUMENTS

DE 102004061869 A1 7/2006

OTHER PUBLICATIONS

German Office Action dated Nov. 24, 2009 for corresponding German Patent Application No. DE 10 2009 022 074.7-54 with English translation.

\* cited by examiner

*Primary Examiner* — Bernard Rojas
(74) *Attorney, Agent, or Firm* — Lempia Summerfield Katz LLC

(57) ABSTRACT

A magnetic field generating device includes a housing and a cryogenically coolable superconducting magnetic coil that is accommodated in the housing. The housing includes a deep-drilled hole, through which coolant flows.

19 Claims, 2 Drawing Sheets

MAGNETIC FIELD GENERATING DEVICE

This application claims the benefit of DE 10 2009 022 074.7 filed May 20, 2009, which is hereby incorporated by reference.

BACKGROUND

The present embodiments relate to a magnetic field generating device.

To perform magnetic resonance imaging (MRI), very powerful magnetic fields and electromagnetic alternating fields are generated in an MRI scanner in order to excite hydrogen nuclei. Image slices of the body of a patient are produced on the basis of the received electromagnetic fields. An MRI scanner includes a powerful magnet, which generates a steady-state magnetic field, gradient coils in X-, Y- and Z-direction with amplifiers, an RF transmitter and an RF receiver, which detects and amplifies an MR signal. Various computers are used for control and analysis.

To generate the steady-state magnetic field, a superconducting magnet is used. The electrical resistance of the superconducting magnet is reduced to zero by cooling to approximately 4 K so that the magnetic coil becomes superconducting. In practice, liquid helium, which is contained in a cryostat, is used as a coolant. Conventional MRI scanners therefore have a cavity (e.g., annular cavity), which is almost completely filled with liquid helium in order to keep the magnetic coils in the superconducting state. However, this has the disadvantage that a very large amount of helium (e.g., 1 m$^3$) is used to fill the cavity. As helium tends to evaporate, the helium is regularly replenished, resulting in significant costs. Also, in many countries, a supply of helium in large quantities is difficult to obtain.

SUMMARY AND DESCRIPTION

The present embodiments may obviate one or more of the drawbacks or limitations in the related art. For example, in one embodiment, the amount of coolant used for a magnetic field generating device (e.g., an MRI scanner) is reduced.

In the present embodiments, a magnetic field generating device includes a housing that has at least one deep-drilled hole, through which coolant flows.

The present embodiments are based on the idea of using the coolant (e.g. helium) where the coolant is actually required for cooling. In contrast to conventional MRI scanners, the entire relatively large annular interior of the housing, in which the magnetic coils are accommodated, is not filled with coolant; instead, one or more holes drilled in the housing are filled with coolant. The advantage of this is that the amount of coolant used may be reduced quite significantly, thus reducing the manufacturing and operating costs.

In one embodiment, the housing of the magnetic field generating device includes a plurality of deep-drilled holes, thereby enabling the areas of the housing, in which at least one magnetic coil is rendered superconducting and kept in that state, to be selectively cooled. In one embodiment, some or all of the holes are interconnected to form a conduit system.

In one embodiment, the conduit system is connected to the coolant supply via at least one inlet and at least one outlet.

In one embodiment of the magnetic field generating device, the at least one drilled hole is disposed approximately parallel to the magnetic coil or approximately parallel to a section of the magnetic coil. In this way, the cooling capacity is provided where the cooling capacity is actually needed (e.g., directly at a magnetic coil), thereby reducing both the amount of coolant used and the energy required for cooling.

In one embodiment, the magnetic field generating device is produced by connecting the housing and the at least one magnetic coil to one another via a plurality of mutually spaced welds. Continuous or spot welds are used as contact bridges for the cooling of the at least one magnetic coil by the coolant.

With the magnetic field generating device according to the present embodiments, if the coolant is essentially only in the at least one drilled hole, the inlet and the outlet, the amount of coolant used is considerably reduced compared to conventional magnetic field generating devices. In one embodiment, it may be possible to reduce the amount of coolant by a factor of 50.

In one embodiment of the magnetic field generating device, the total amount of coolant is approximately 0.01 to 0.05 m$^3$ (e.g., 0.02 m$^3$).

The present embodiments also relate to a method for manufacturing a magnetic field generating device (e.g., an MRI scanner) having at least one cryogenically cooled superconducting magnetic coil that is accommodated in a housing.

In one embodiment of the method for manufacturing the magnetic field generating device, the method includes deep-drilling at least one hole for coolant in the housing. Deep hole drilling is a specialist drilling method, in which, unlike in conventional drilling with long twist drills, special drills are used, as the drill head is guided in the hole. Using the guiding of the deep drilling tool on the cylindrical circumferential surface of the hole, great drilling depths may be achieved without the hole running out of true.

In one embodiment, the method for manufacturing the magnetic field generating device includes drilling the at least one hole in a plate and rolling the plate to form a tubular housing. Correspondingly, one hole or a plurality of holes are drilled in the housing, which is re-shaped into the tubular housing. This manufacturing method is particularly efficient and therefore cost-effective.

In one embodiment, the method for manufacturing the magnetic field generating device includes welding the joint of the plate rolled to form the tubular housing to provide a welded seam. The welding of the longitudinal seam may be automated.

In one embodiment of the method for manufacturing the magnetic field generating device, the plate is made of stainless steel or a light metal alloy (e.g., an aluminum alloy). This material enables particularly good cooling of the magnetic coils to be achieved.

According to another embodiment of the method for manufacturing the magnetic field generating device, the at least one drilled hole is provided with a sealing plug at one or both ends. The sealing plug or plugs are inserted prior to the rolling and welding of the plate so that no coolant may escape from the ends of the drilled hole.

DETAILED DESCRIPTION OF THE DRAWINGS

Figure 1:
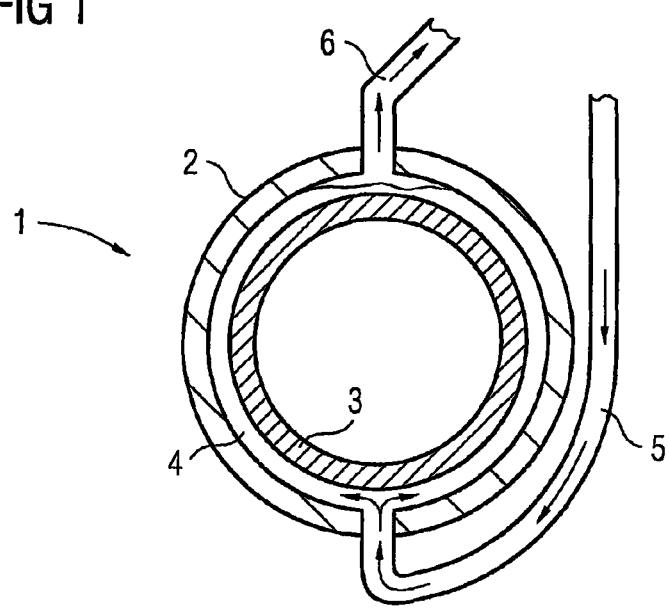
FIG. 1 shows a section through a conventional magnetic field generating device for an MRI scanner.

FIG. 1 shows a sectional view of a conventional magnetic field generating device 1 that includes an outer annular magnet body 2 and an inner annular magnet body 3, which delimit a tubular annulus 4 filled with liquid helium as a coolant. The outer and inner annular magnet bodies 2, 3 are parts of a magnetic coil of a superconducting magnet that produces a steady-state magnetic field. The helium is supplied to the magnetic field generating device 1 via an inlet 5 and discharged via an outlet 6. As the amount of helium used is approximately 1 m$^3$, the manufacture and operation of the magnetic field generating device 1 shown in FIG. 1 are complex and costly.

Figure 2:
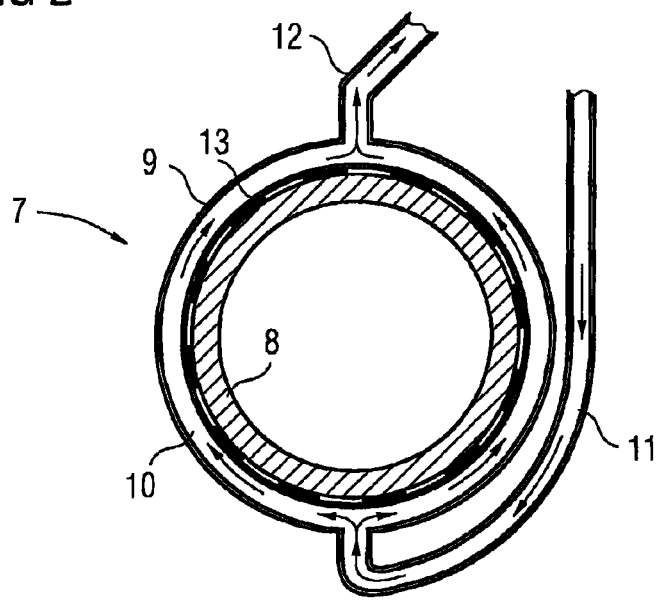
FIG. 2 shows a section through one embodiment of a magnetic field generating device.

FIG. 2 illustrates one embodiment of a magnetic field generating device 7 that includes an annular magnet body serving as a magnetic coil 8 and enclosing the magnetic coil 8, a housing 9 (e.g., a former 9 or a tubular housing 9) of cylindrical design, in which the magnetic coil 8 is disposed. The housing 9 includes a plurality of approximately parallel drilled holes 10 extending over the entire circumference of the housing 9. As shown in FIG. 2, a hole 10 is connected to an inlet 11, through which helium is supplied as a coolant. Where the inlet 11 enters the hole 10, the flow of helium is split into two sub-flows, which are reunited at an opposite end in the circumferential direction and flow into an outlet 12. The inlet 11 and the outlet 12 are connected to a cooling device (not shown in FIG. 2), which cools the coolant to approximately 4 K.

In one embodiment, the housing 9 is made of aluminum. For manufacture of the housing 9, an aluminum plate is provided, and a plurality of approximately parallel holes 10 is deep-drilled in the aluminum plate. The aluminum plate is rolled into an annular shape and welded along a longitudinal seam, thereby producing the housing 9.

The housing 9 is connected to the magnetic coil 8 or a plurality of magnetic coils 8 via spot welds 13 distributed circumferentially, such that the magnetic coil 8 or magnetic coils 8 are accommodated in the housing 9. The desired cooling of the magnetic coil 8 takes place via the spot welds 13 so that the coil is rendered superconducting. The spot welds 13 constitute contact bridges, via which the magnetic coil is cooled.

Figure 3:
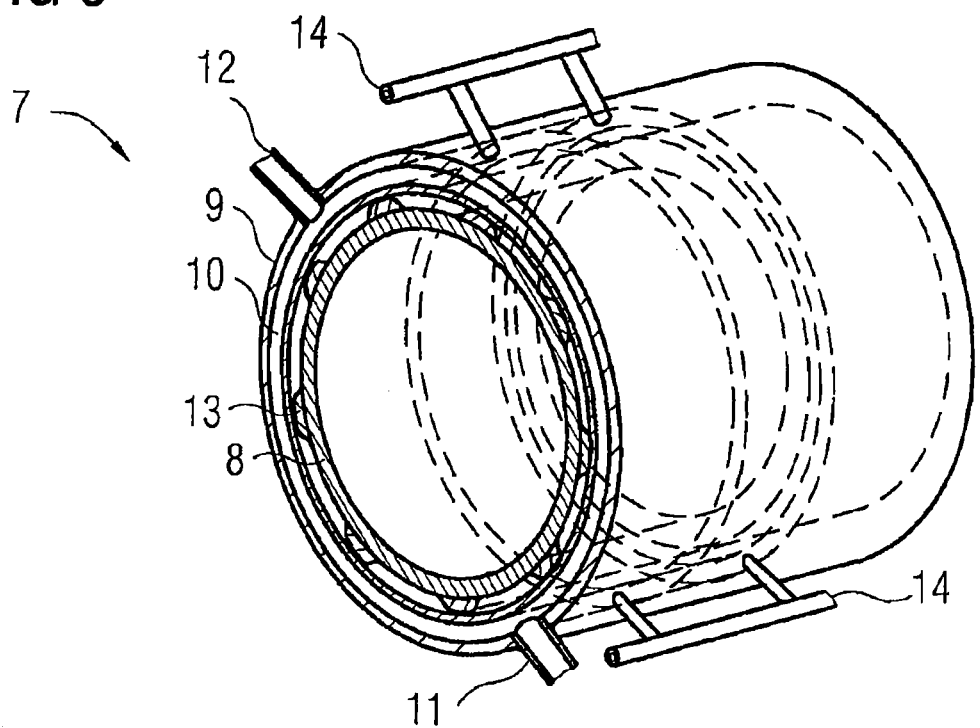
FIG. 3 shows a sectional side view of the one embodiment of the magnetic field generating device from FIG. 2.

FIG. 3 shows a perspective view of the one embodiment of the magnetic field generating device shown in FIG. 2. FIG. 3 shows that the magnetic field generating device 7 has a plurality of magnetic coils 8 disposed approximately parallel to one another, each enclosed by a drilled hole 10 in the housing 9. The holes 10 are interconnected via headers 14 disposed longitudinally outside the housing 9 and form a conduit system.

Figure 4:
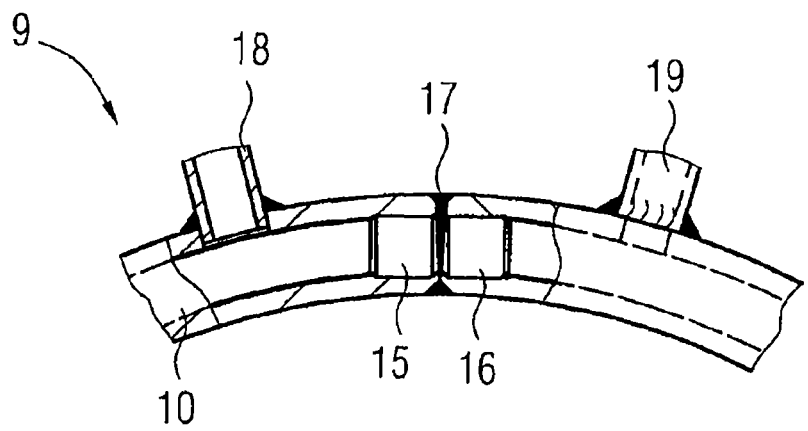
FIG. 4 shows an enlarged sectional view of a housing of the magnetic field generating device in the region of a weld.

FIG. 4 shows a sectional view of one embodiment of the housing 9 in the region of the welded longitudinal seam. Prior to rolling of the aluminum plate to form the tubular housing 9, the two open ends of the hole 10 are sealed with cylindrical sealing plugs 15, 16 so as to prevent the discharge of helium. The joint of the rolled aluminum plate is sealed by a welded seam 17 running in the longitudinal direction, the welding process being performed automatically. Mounted on both sides of the welded seam 17 are pipe sockets 18, 19 enabling the hole 10 to be filled with a coolant such as, for example, helium. About 0.02 m$^3$ of coolant is used for the embodiments of the magnetic field generating device 7 shown in FIGS. 2 to 4.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic field generating device comprising:
   a housing; and
   a cryogenically coolable superconducting magnetic coil that is disposed in the housing,
   wherein the housing comprises a deep-drilled hole, through which coolant flows, and
   wherein the housing comprises a plate, in which the deep-drilled hole is produced, the plate being rolled up to produce a tubular housing, such that the deep-drilled hole extends over the entire circumference of the housing.

2. The magnetic field generating device as claimed in claim 1, wherein the housing comprises a plurality of deep-drilled holes, the plurality of deep-drilled holes comprising the deep-drilled hole.

3. The magnetic field generating device as claimed in claim 2, wherein some or all deep-drilled holes of the plurality of deep-drilled holes are interconnected to form a conduit system.

4. The magnetic field generating device as claimed in claim 3, wherein the conduit system is connected to a coolant supply via an inlet and an outlet.

5. The magnetic field generating device as claimed in claim 2, wherein the plurality of deep-drilled holes are disposed approximately parallel to the magnetic coil or approximately parallel to a section of the magnetic coil.

6. The magnetic field generating device as claimed in claim 2, wherein the coolant is essentially only in the plurality of deep-drilled holes, an inlet and an outlet.

7. The magnetic field generating device as claimed in claim 1, wherein the deep-drilled hole is disposed approximately parallel to the magnetic coil or approximately parallel to a section of the magnetic coil.

8. The magnetic field generating device as claimed in claim 7, wherein the housing and the magnetic coil are interconnected via a plurality of mutually spaced spot welds.

9. The magnetic field generating device as claimed in claim 1, wherein the housing and the magnetic coil are interconnected via a plurality of mutually spaced spot welds.

10. The magnetic field generating device as claimed in claim 1, wherein the coolant is essentially only in the deep-drilled hole, an inlet and an outlet.

11. The magnetic field generating device as claimed in claim 10, wherein the total amount of coolant is approximately 0.02 m$^3$.

12. The magnetic field generating device as claimed in claim 1, wherein the total amount of coolant is approximately 0.01 to 0.05 m$^3$.

13. A method for manufacturing a magnetic field generating device, the method comprising:
    deep-drilling, using a drill, a hole, through which coolant flows, in a plate of a housing;
    rolling the housing to form a tubular housing, such that the deep-drilled hole extends over the entire circumference of the housing; and
    positioning a cryogenically coolable superconducting magnetic coil in the housing,
    wherein the deep-drilling comprises guiding a drill head of the drill in the hole.

14. The method for manufacturing the magnetic field generating device as claimed in claim 13, further comprising:
    seam-welding a joint of the housing rolled to form the tubular housing.

15. The method for manufacturing the magnetic field generating device as claimed in claim 13, wherein the plate is made of stainless steel or a light metal alloy.

16. The method for manufacturing a magnetic field generating device as claimed in claim 13, wherein the hole deep-drilled in the plate is provided with a sealing plug at one or both ends.

17. The method for manufacturing the magnetic field generating device as claimed in claim 14, wherein the plate is made of stainless steel or an aluminum alloy.

18. The method for manufacturing a magnetic field generating device as claimed in claim 14, wherein the hole deep-drilled in the plate is provided with a sealing plug at one or both ends.

19. The method for manufacturing a magnetic field generating device as claimed in claim 15, wherein the hole deep-drilled in the plate is provided with a sealing plug at one or both ends.

\* \* \* \* \*